US009431564B2

(12) United States Patent
Davies

(10) Patent No.: US 9,431,564 B2
(45) Date of Patent: Aug. 30, 2016

(54) PHOTOCONDUCTIVE SWITCH

(75) Inventor: John Davies, Crawley (GB)

(73) Assignee: THALES HOLDING UK PLC, Surrey (GB)

( * ) Notice: Subject to any disclaimer, the term of this patent is extended or adjusted under 35 U.S.C. 154(b) by 1757 days.

(21) Appl. No.: 10/536,128

(22) Filed: Sep. 29, 2009

(65) Prior Publication Data

US 2015/0349182 A1    Dec. 3, 2015

(30) Foreign Application Priority Data

Jul. 29, 2008  (GB) .................................. 0813843.0

(51) Int. Cl.
*G01J 1/44* (2006.01)
*H01L 31/09* (2006.01)
*H03K 17/78* (2006.01)
(52) U.S. Cl.
CPC ............... *H01L 31/09* (2013.01); *H03K 17/78* (2013.01); *G01J 1/44* (2013.01)
(58) Field of Classification Search
CPC ........................................................ G01J 1/44
USPC .................... 343/895; 250/341.1, 338.1, 206
See application file for complete search history.

(56) References Cited

U.S. PATENT DOCUMENTS

| 4,546,249 | A |   | 10/1985 | Whitehouse et al. |
| 5,515,066 | A | * | 5/1996  | Kim et al. ................. 343/895 |
| 6,184,054 | B1|   | 2/2001  | Tsay |
| 6,342,721 | B1|   | 1/2002  | Nolte et al. |
| 6,348,683 | B1| * | 2/2002  | Verghese et al. .......... 250/214.1 |
| 7,291,839 | B1| * | 11/2007 | Demers et al. ............ 250/341.1 |

FOREIGN PATENT DOCUMENTS

| GB | 2254730 A    | 10/1992 |
| GB | 2438445 A    | 11/2007 |
| WO | 03/067677 A2 | 8/2003  |

OTHER PUBLICATIONS

Sep. 25, 2008 Search Report issued in United Kingdom Application No. 0813843.0.

* cited by examiner

*Primary Examiner* — Mark Hellner
(74) *Attorney, Agent, or Firm* — Oliff PLC

(57) ABSTRACT

A photoconductive switch comprising a photoconductive material and first and second contacts provided on said photoconductive material, wherein said first and second contacts comprise a plurality of interdigitated tracks, the tracks of each contact being separated from the tracks of the other contact by a photoconductive gap, the tracks being curved such that the minimum photoconductive gap measured in a first direction remains substantially similar regardless of the orientation of the first direction.

13 Claims, 3 Drawing Sheets

PHOTOCONDUCTIVE SWITCH

The present invention relates to a photoconductive switch. More specifically, the present invention relates to a photoconductive switch which is particularly suitable for use in sample and hold circuits.

Optical pulses of a few picoseconds can turn on photoconductive switches. This allows photoconductive switches to be used to directly sample a microwave signal at frequencies of up to 20 GHz and beyond by transferring the sampled voltage to a storage capacitance. The storage voltage is then filtered before amplification and sampling by a conventional electrical analogue-to-digital converter.

Standard photoconductive switches generally comprise a first contact and a second contact, a plurality of fingers extending from the first contact and a plurality of fingers extending from the second contact. The first contact and second contact are arranged opposing each other such that the fingers form an inter-digitated array.

The photoconductive switch is generally actuated using light delivered to the photoconductive switches via a single-mode fibre from a laser. Any movement or bending of this single-mode fibre causes significant rotation of the polarisation of the light. The ON resistance of the standard linear device is dependent on the polarisation direction of the radiation used to activate the switch.

If the standard photoconductive switch is used in an environment where it is subjected to vibrations, shocks, or accelerations, for example if provided on a ship, vehicle or aircraft, then movement of the fibre optic cables causes variations in the polarisation of the radiation which impinges on the device. Thus, during sampling, the ON resistance of the device is continually changing which seriously affects the results derived from the device. Any changes in ON resistance significantly affect the output voltage of the device.

The present invention at least partially addresses the above problems and in a first aspect provides a photoconductive switch comprising a photoconductive material and first and second contacts provided on said photoconductive material, wherein said first and second contacts comprise a plurality of interdigitated tracks, the tracks of each contact being separated from the tracks of the other contact by a photoconductive gap, the tracks being arranged such that a minimum photoconductive gap measured in a first direction remains substantially the same or similar regardless of the orientation of the first direction.

In a preferred embodiment, the tracks are generally circular. However, they may be elliptical, octagonal or other polygonal shape exhibiting a high degree of rotational symmetry.

The tracks may be arranged in a generally concentric manner. In a preferred embodiment, the first and second contacts each comprise a central spine and said fingers extend from said spines.

The area of the pattern created by the interdigitated contacts is preferably less than 1500 $\mu m^2$, more preferably approximately 25 $\mu m \times 25$ $\mu m$.

The photoconducting switch may also be provided with an optical fibre which is positioned to illuminate the photoconducting gap. The fibre may be a single mode fibre.

The photoconducting switch of the present invention may be used for a range of uses, for example as a high speed photo detector in optical fibre communications. However, it is of particular use in a switch and hold circuit for example for sampling a microwave signal.

Such a circuit may further comprise compensating means configured to compensate for extraneous signals arising from the operation of said photoconductive switch. The compensating means may be in the form of a switch or a dummy switch which passes a signal which is to be cancelled from the extraneous signal. Further methods of inhibiting extraneous signals are also disclosed in GB2438445.

In a second aspect, the present invention provides a method of optically switching, the method comprising providing a photoconductive switch comprising a photoconductive material and first and second contacts provided on said photoconductive material, wherein said first and second contacts comprise a plurality of interdigitated tracks, the tracks of each contact being separated from the tracks of the other contact by a photoconductive gap, the tracks being arranged such that the minimum photoconductive gap measured in a first direction remains substantially the same or similar regardless of the orientation of the first direction.

The present invention will now be described with reference to the following non-limiting embodiments in which.

Figure 1:
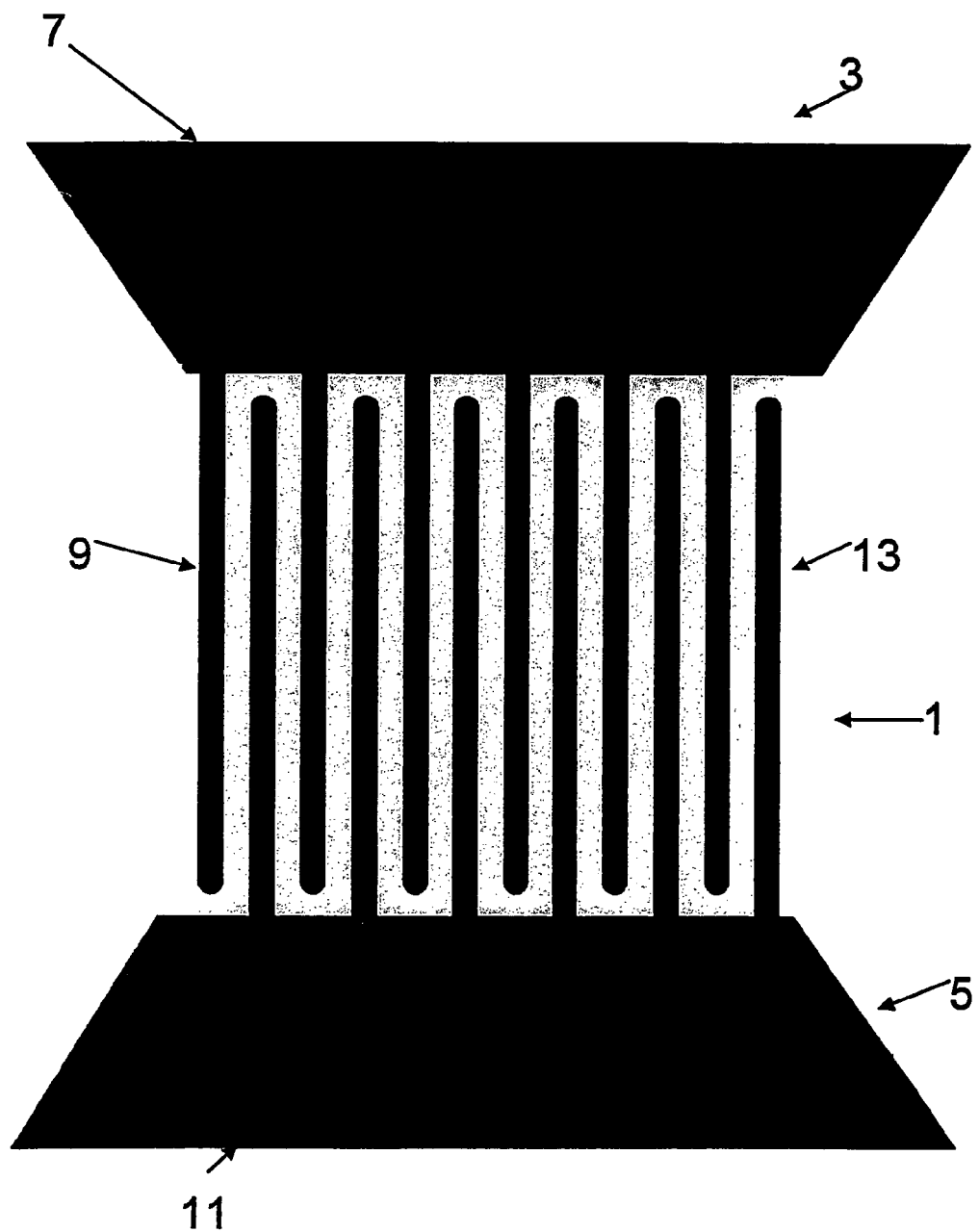
FIG. 1 is a schematic of a prior art inter-digitated photoconductive switch.

FIG. 1 shows a known photoconductive switch. The photoconductive switch 1 comprises a first contact 3 and a second contact 5.

The device is fabricated on a semiconductor material, for example low-temperature gallium arsenide. Gallium arsenide is chosen because it is more sensitive at wavelengths of approximately 800 nm which are of particular use and has a particularly high frequency response for any applied signal to be sampled.

The contacts 3 and 5 comprise gold/titanium and are provided on the semiconductor using standard processing techniques such as photolithography or E-beam lithography followed by evaporation.

The contact 3 comprises a large area contact pad 7. Six thin fingers or tracks 9 extend from one edge of contact pad 7. Each of the fingers 9 has a length of approximately 25 $\mu m$ and has a width approximately 1 $\mu m$. The second contact 5 also comprises a large area contact 11 with six tracks 13 which extend from one edge of pad 11. The 6 tracks 13 are also finger like and extend for 25 $\mu m$ and have a track width 1 $\mu m$.

The six tracks 9 of the first contact 3 are interleaved with the six tracks 13 of the second contact 5. Thus, the six tracks 9 and six tracks 13 form twelve interdigitated fingers. The interdigitated fingers have a gap of 1 $\mu m$ between each finger. However, these gaps may be reduced to 0.75 $\mu m$ or less to reduce the insertion loss of the overall device.

The photoconducting switch 1 is placed in a current path such that the pad 7 of first contact is connected to a current source. No current will flow through switch 1 unless it is irradiated by radiation of a wavelength which causes the semiconductor material to conduct. For the semiconductor material described above, photoconduction occurs at 800 nm.

Radiation is generally delivered to such a switch via a fibre optic cable. Usually a single mode fibre optic. Any movement or bending of such a single mode fibre causes significant rotations of the polarisation of light travelling along the cable. If the polarisation of the incident radiation which is used to activate or deactivate the switch changes, then the ON resistance of the switch changes. Any ON resistance change causes an equal or similar change in the device output voltage amplitude.

Therefore, if the photoconducting switching is being used in an environment where it is subject to vibrations, shocks or accelerations, the ON resistance of the device can continually change causing the device to produce inaccurate results.

Figure 2:
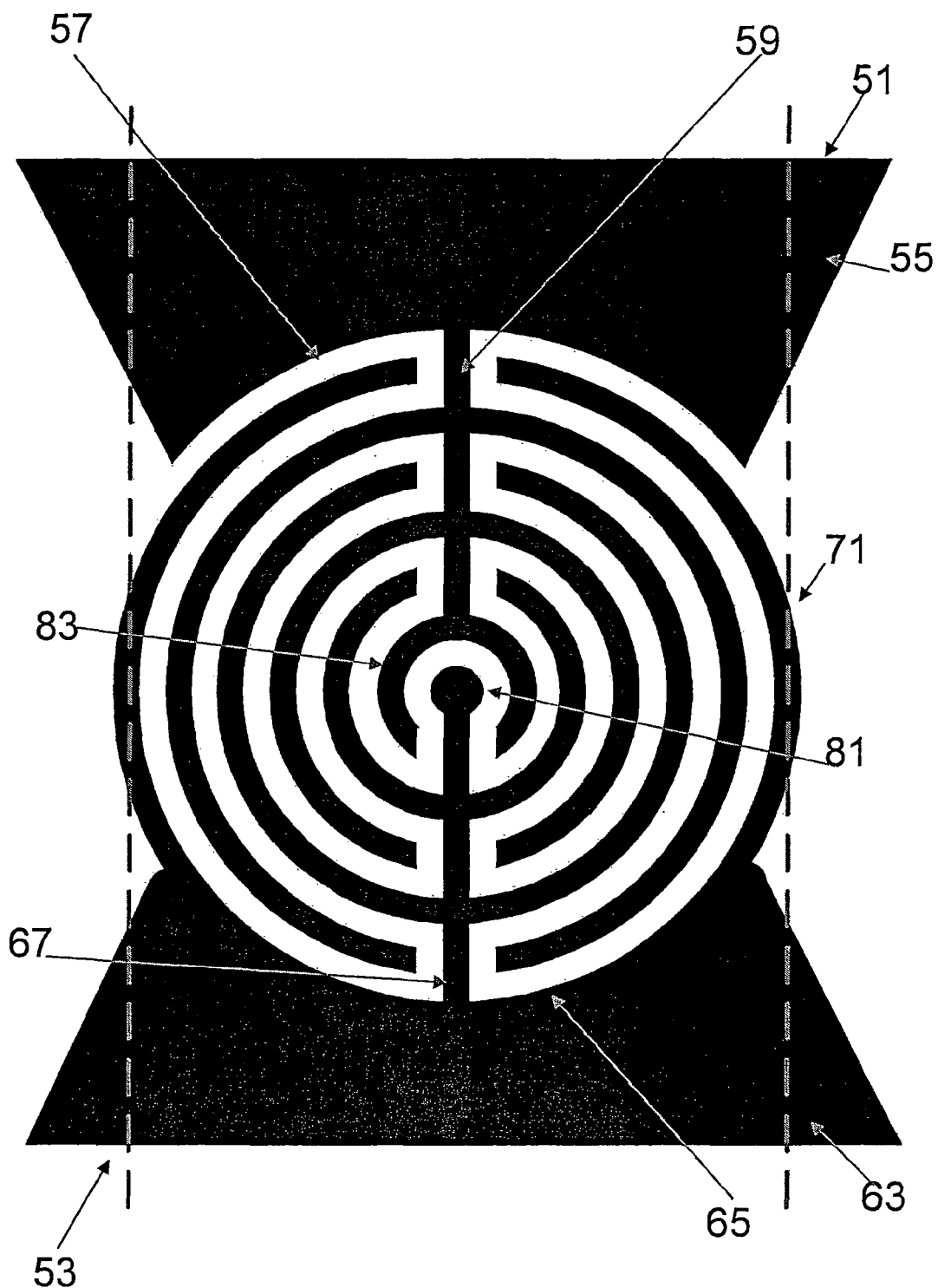
FIG. 2 is a schematic of an inter-digitated photoconductive switch in accordance with an embodiment of the present invention.

FIG. 2 schematically illustrates a device in accordance with an embodiment of the present invention. As for FIG. 1, the photoconductive switch comprises a photoconductive material on which a first contact 51 and a second contact 53 are provided. The first contact 51 comprises a contact pad 55. One edge 57 of the contact pad 55 is concave. From the centre of this concave edge extends a straight spine 59. Six tracks extend from spine 59. Three tracks extend from one side of the spine and three tracks from the opposing side of spine 59. The tracks are curved so that each pair of tracks nearly forms a complete circle.

Second contact 53 also comprises a pad 63 and one edge 65 of pad 63 is concave. From concave edge 65 there extends a central spine 67 and tracks 69 extend from central spine 67. A first pair of tracks which extend from opposite sides of spine 67 form a near circular arrangement and a second pair of tracks extend from a second position on spine 67 and form a near circular arrangement.

The first contact 51 and the second contact 53 are arranged to oppose each other and the circular tracks interleave to form circular interdigitated contacts. From above, the tracks form concentric rings which are separated by an approximately 1 µm gap. In addition to the tracks which extend from central spines 59 and 67, there is an outer pair of part circular tracks 71 which extend from the ends of concave edge 65.

The spine 67 of the second contact 53 terminates in a filled circle 81. The end pair of tracks 83 of the first contact 51 form a cup around this filled circle and the further tracks from the second then first contacts are interleaved around this forming a generally concentric ring pattern. The outermost tracks are the tracks 71 which extend directly from the concave edge 65 of the second contact 53.

The track area is approximately 25 µm×25 µm. The track widths are approximately 1 µm, except for the filled circle which has double the basic track width. Inter-track spacing is also approximately 1 µm both between the curved portions of the tracks and the edge portions of the tracks and the spine, though this may be reduced to 0.75 µm or less in order to minimise device insertion loss. Due to the circular design, as the polarisation of incident light is rotated the same ON resistance should be experienced regardless of any variation in the polarisation direction. Thus the output voltage remains constant and unchanging despite polarisation changes of the incident illumination.

Figure 3:
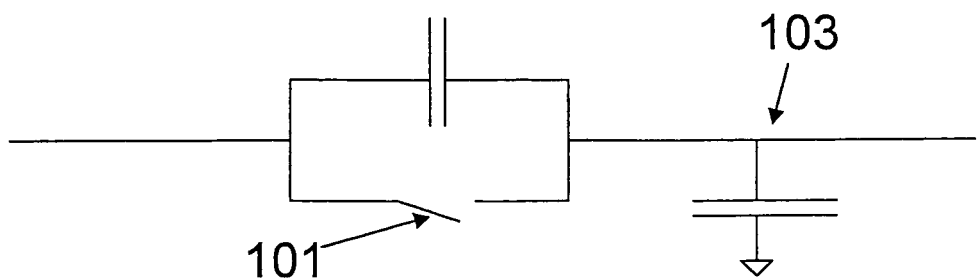
FIG. 3 is a basic sample and hold circuit using a photoconductive switch in accordance with an embodiment of the present invention.

Photoconductive switches are often used in so-called sample and hold circuits. FIG. 3 shows a simple sample and hold circuit with a photoconductive switch 101 of the type described with reference to FIG. 2 and a hold capacitor 103.

Photoconductive sample and hold circuits are used in sampling circuits as they sample faster and with greater operational bandwidth for the input signal than their non-photonic counterparts.

The capacitor shown in parallel with the switch in FIG. 3 represents the parasitic capacitance of the switch and associated circuit elements. It is this parasitic capacitance that results in undesirable, though largely unavoidable, leakage while the switch is in the OFF state.

The design presented in FIG. 2 has approximately similar parasitic capacitance to the conventional inter-digitated design shown in FIG. 1 and therefore also has approximately similar leakage in the OFF state.

The circuit of FIG. 3 is used to directly sample a wide band microwave signal sampler. When implemented using low-temperature Gallium Arsenide (LT GaAs), it is capable of directly sampling microwave signals at up to 40 GHz or beyond.

The design presented in FIG. 2 is applicable to any configuration of photoconductive switches whether single switch (such as that shown in FIG. 3) or multiple switch configuration. All the aforementioned advantages of the design of FIG. 2 apply equally to any combination of switch or switches.

The invention claimed is:

1. A photoconductive switch comprising:
a planar photoconductive material and
first and second contacts provided on said photoconductive material,
wherein said first and second contacts comprise a plurality of interdigitated tracks, the tracks of each contact being separated from the tracks of the other contact by a photoconductive gap, the tracks being curved such that the minimum photoconductive gap measured in a first direction remains substantially similar regardless of the orientation of the first direction, and
wherein said tracks are generally concentric and possess a high degree of rotational symmetry.

2. A photoconductive switch according to claim 1, wherein the tracks are generally circular.

3. A photoconductive switch according to claim 1, wherein said first and second contacts each comprise a central spine and said interdigitated tracks extend from said spine.

4. A photoconductive switch according to claim 3, wherein the spine of said first contact has a circular end piece and the spine of said second contact terminates in a cup shaped end piece configured to partially surround said end piece of the first spine.

5. A photoconductive switch according to claim 1, wherein the minimum photoconductive gap is between 0.5 µm and 1.5 µm.

6. A photoconductive switch according to claim 1, wherein an area of a pattern created by the interdigitated contacts is less than 1500 µm³.

7. A photoconductive switch according to claim 1, further comprising an optical fiber configured to illuminate said photoconductive gap.

8. A photoconductive switch according to claim 7, wherein said optical fiber is a single mode fiber.

9. A photoconductive switch according to claim 7, wherein said fiber is configured to deliver radiation having a wavelength in the range from 530 nm to 900 nm.

10. A circuit comprising a photoconductive switch according to claim 1 and a holding means configured to retain an output of said photoconductive switch.

11. A circuit according to claim 10, further comprising an analog to digital converter, the circuit being adapted to direct the output of the holding means to said analog to digital converter.

12. A circuit according to claim 11, further comprising compensating means configured to compensate for extraneous signals arising from the operation of said photoconductive switch.

13. A method of optically switching, the method comprising:

providing a photoconductive switch comprising:
  a planar photoconductive material and
  first and second contacts provided on said photoconductive material,
  wherein said first and second contacts comprise a plurality of interdigitated tracks, the tracks of each contact being separated from the tracks of the other contact by a photoconductive gap, the tracks being arranged such that the minimum photoconductive gap measured in a first direction remains substantially similar regardless of the orientation of the first direction, and
  wherein said tracks are generally concentric and possess a high degree of rotational symmetry; and
irradiating the switch to turn it on.

* * * * *